United States Patent [19]

Taskar et al.

[11] Patent Number: 5,399,524
[45] Date of Patent: Mar. 21, 1995

[54] METHOD OF PROVIDING AN OHMIC TYPE CONTACT ON P-TYPE ZN(S)SE

[75] Inventors: Nikhil R. Taskar; Babar A. Khan, both of Ossining; Donald R. Dorman, Carmel, all of N.Y.

[73] Assignee: Philips Electronics North America Corporation, New York, N.Y.

[21] Appl. No.: 133,545

[22] Filed: Oct. 7, 1993

Related U.S. Application Data

[62] Division of Ser. No. 878,657, May 5, 1992, Pat. No. 5,293,074.

[51] Int. Cl.$^6$ .................... H01L 21/44; H01L 21/48
[52] U.S. Cl. ............................... 437/185; 437/912
[58] Field of Search ............. 437/185, 912, 184; 257/78; 148/DIG. 64, DIG. 63

[56] References Cited

U.S. PATENT DOCUMENTS

| | | | |
|---|---|---|---|
| 5,045,897 | 9/1991 | Ahlgren | 257/94 |
| 5,274,269 | 12/1993 | DePuydt et al. | 257/744 |

FOREIGN PATENT DOCUMENTS

| | | |
|---|---|---|
| 62-16921 | 7/1988 | Japan . |
| 62297359 | 6/1989 | Japan . |
| 63-10824 | 7/1989 | Japan . |

Primary Examiner—Olik Chaudhuri
Assistant Examiner—H. Jey Tsai
Attorney, Agent, or Firm—Norman N. Spain

[57] ABSTRACT

A method of providing an improved ohmic contact on an p-type ZnSe or ZnSSe layer provided on a substrate comprising immersing the layer in a Hg bath heated to a temperature in excess of 200° C. for more than two hours.

7 Claims, 9 Drawing Sheets

METHOD OF PROVIDING AN OHMIC TYPE CONTACT ON P-TYPE ZN(S)SE

This is a division of application Ser. No. 07/878,657, filed May 5, 1992, now U.S. Pat. No. 5,394,074.

BACKGROUND OF THE INVENTION

It is well known that it is very difficult to form an ohmic contact to a p-type zinc selenide layer. This is particularly so, even for a heavily doped P-type zinc selenide.

The cause of this problem is probably due to the relatively high Schottky barriers of the various metals used to make the contact, these barriers being about 1eV.

There have been many attempts to solve this problem. Thus, Uemoto J. Appl. No. 622-297359 teaches forming an ohmic contact by growing a p-type amorphous Si layer by a photo-assisted CVD method on the p-type ZnSe layer and then depositing Mo and Al on the Si layer. However, since there is no grading of the p-type amorphous layer, a barrier of only a few tenths of a volt may result in the prevention of the formation of an ohmic contact. Additionally, since there is no continuity of the lattice of the ZnSe layer into the deposited amorphous Si layer, the amorphous layer probably can be easily peeled away from the ZnSe layer thus resulting in poor mechanical integrity of the Si-pZnSe contact.

Okawa J. Appl. No. 62 16921 teaches the formation of an ohmic contact by the evaporation of a gold layer directly on the surface of a p-type ZnSe layer to which nitrogen ion acceptors have been added. It has been found, however that the contact actually formed is not an ohmic contact but is a Schottky contact with a barrier of about 1.4 eV. Such a contact requires the application of about 15 V or larger to achieve current density in the order of 10 A/cm$^2$.

Basol U.S. Pat. No. 4,456,630 teaches a method of forming ohmic contacts on 11B-V1A p-type doped layers by etching the surface of the layers with an acidic solution to form a surface that is non-metal rich, treating the etched surface with a basic solution and then depositing a conductive metal layer. The only example shown of the p-type material is p-type cadmium telluride. Moreover, the method shown here does not work for p-ZnSe.

McCaldin et al U.S. Pat. No. 4,123,295 teaches forming an ohmic contact on a p-type ZnSe layer by use of an intermediate layer of HgSe or HgS. However, in the absence of any grading of the HgSe layer (which is not shown) an ohmic contact is actually not formed but a Schottky barrier of about 0.7 eV is found.

Kamata J. Appl. No. 63-10826 teaches the formation of an ohmic contact on a p-doped ZnSSe layer by providing an intermediate layer of p-type GaAs between the metal contact layer and the ZnSSe layer. However, it has been found that here too an ohmic contact is actually not formed since the barrier between the p-type ZnSe and p-type GaAs is about 1 eV.

SUMMARY OF THE INVENTION

It is a principal object of this invention to provide a semiconductor structure in which there is present either a p-type ZnSe layer or a p-type ZnSSe layer provided with an improved ohmic contact.

This and other objects of the invention will be apparent from the description that follows.

According to one aspect of the invention a semiconductor structure comprising a p-type ZnSe layer is provided with an improved ohmic contact to the ZnSe layer by forming, on the surface of the ZnSe layer, a mercury zinc sulfoselenide, telluride, sulfotelluride, sulfide or selenide or a mercury zinc salt of a mixture of selenium and tellurium in which sulfur may be present and in which the concentration of mercury increases from zero at the surface of the ZnSe layer. The formula of this ohmic contact is $Hg_xZn_{1-x}Se_bS_c$ wherein $x=0-1$ and is 0 at the surface of the ZnSe layer and increases thereafter, $a=0-1$, $b=0-1$, $c=0-1$ and $a+b+c=1$.

According to a further aspect of the invention the formula of this ohmic contact is $Hg_xZn_{1-x}Se_bS_c$ wherein $x=0-1$, $b=0-1$, $c=0-1$, $b+c=1$ and x is 0 at the surface of the ZnSSe layer and increases thereafter to a value not greater than 1.

According to an additional aspect of the invention the ohmic type contacts of the invention are provided on p-doped ZnSe or ZnSSe layers by immersing these layers in a mercury bath, heated to a temperature in excess of 200° C., for a period of time greater than 120 minutes.

DETAILED DESCRIPTION OF THE INVENTION

According to a preferred aspect of the invention the value of x at the outer surface of the ohmic type contact is 1. Thus, according to this aspect of the invention there is no zinc but mercury present at the outer surface of the ohmic type contact.

According to a still further preferred aspect of the invention a outer surface of the ohmic type contact is in contact with the conductive metallic layer. Examples of metals that may be used for such metallic layers are gold, silver, aluminum, tungsten and other metals used for the formation of conductive layers in the semiconductive art.

Preferably the ohmic type contact is a layer of $Hg_xZn_{1-x}Se$ wherein x varies from 0 at the ZnSe layer to 1 at its outer surface.

The ohmic type contact may be doped or undoped, if doped it preferably p doped. An example of a p dopant that may be employed is lithium.

The ohmic type contact is provided on the ZnSe layer preferably by immersing this layer in a bath of mercury heated to 250° to 350° C. for a period of 4–24 hours. If doping is desired, Li may be added to the Hg bath.

Doping may also be achieved by heating the ohmic type contact to form Hg vacancies.

The conductive metallic layer may be provided by evaporation from a suitable metal upon removal of the ZnSe layer from the Hg bath.

If the ohmic type contact contains tellurium or sulfur the ohmic type contact may be formed by metal organic vapor phase epitaxy or molecular beam epitaxy.

The thickness of the layer forming the ohmic contact of the invention is about 100 Å to 3000 Å and preferably is about 1000 Å to 3000 Å (depending on the doping level in the p-type layer and the graded layer.)

EXAMPLE I

Figure 1:
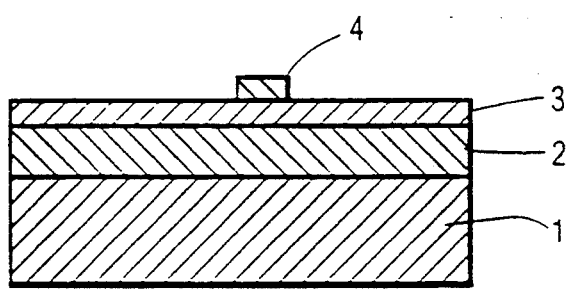
FIG. 1 is a cross-sectional view of a portion of a semiconductor structure comprising a heavily doped p-type zinc selenide layer provided with an ohmic contact of the invention.

Referring to FIG. 1, a semiconductor gallium arsenide substrate 1 was provided with a p-type ZnSe layer 2 of a thickness of 1-2 μm. The p-type ZnSe layer 2 was then immersed in a Hg bath heated to a temperature of 250°-350° C. for a period of 4-24 hours.

As a result there was formed a thin layer 3 of a thickness of 100-200 Å of $Hg_x Zn_{1-x}Se$ in which $x=0-1$ with x being 0 at the interface with the p-type ZnSe layer and 1 at its outer surface. An Au contact 4 of a thickness of about 1000 Å was then provided on the $Hg_xZn_{1-x}Se$ layer by evaporation.

EXAMPLE II

The procedure as described in Example 1 was carried out with the addition in that an amount of Li to provide a Li doped concentration of $10^{16}10^{17}$ cm$^{-3}$ in the resultant $Hg_xZn_{1-x}Si$ layer was added to the Hg bath in the form of solid Li.

1-V plots measured on structures prepared according to these examples are shown in FIGS. 3-9. The information regarding the formation of the $Hg_xZn_{1-x}Se$ layer and the metal contact is given in the heading under "GRAPHICS PLOT".

Figure 3:
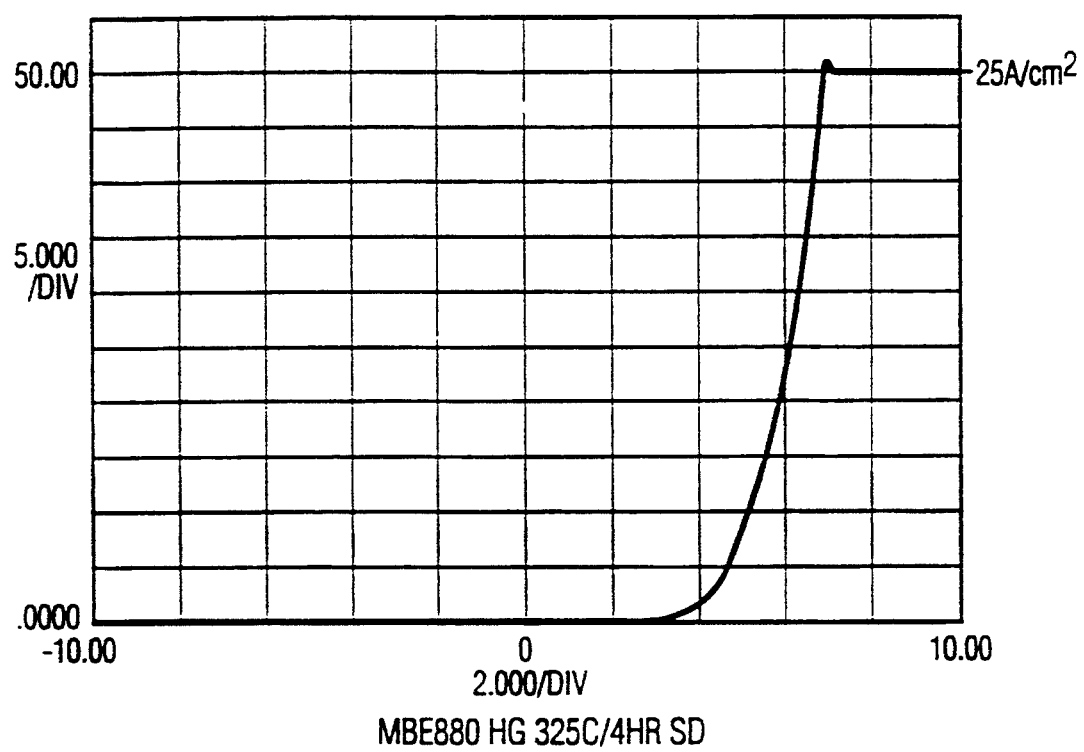
FIGS. 3–9 are I-V plots of a p-type zinc selenide layer provided with the ohmic type contacts of the invention.

Thus in FIG. 3 "MBE 880" identifies the layer, "Hg" indicates that the layer was undoped (i.e. without Li), "325C./4HR" indicates that the alloying was carried out at a temperature of 325Y° C. for a period of 4 hours and "SD" indicates the size of the contact area of the gold contact. In the plot in FIG. 3 this is indicated to be $2 \times 10^{-3}$cm$^2$.

Figure 4:
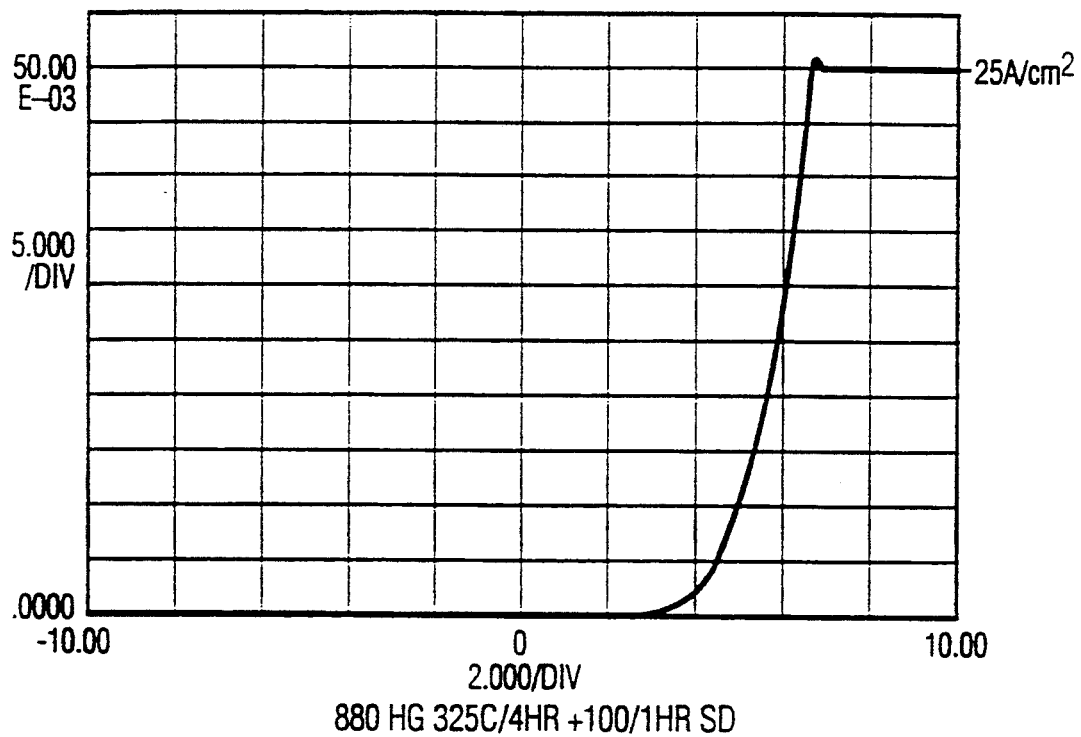

In FIG. 4 "+100C./1hr" indicates that the layer was heated at a temperature of 100° C. for a period of 1 hour after the alloying (following removal from Hg bath) to form Hg vacancies.

Figure 5:
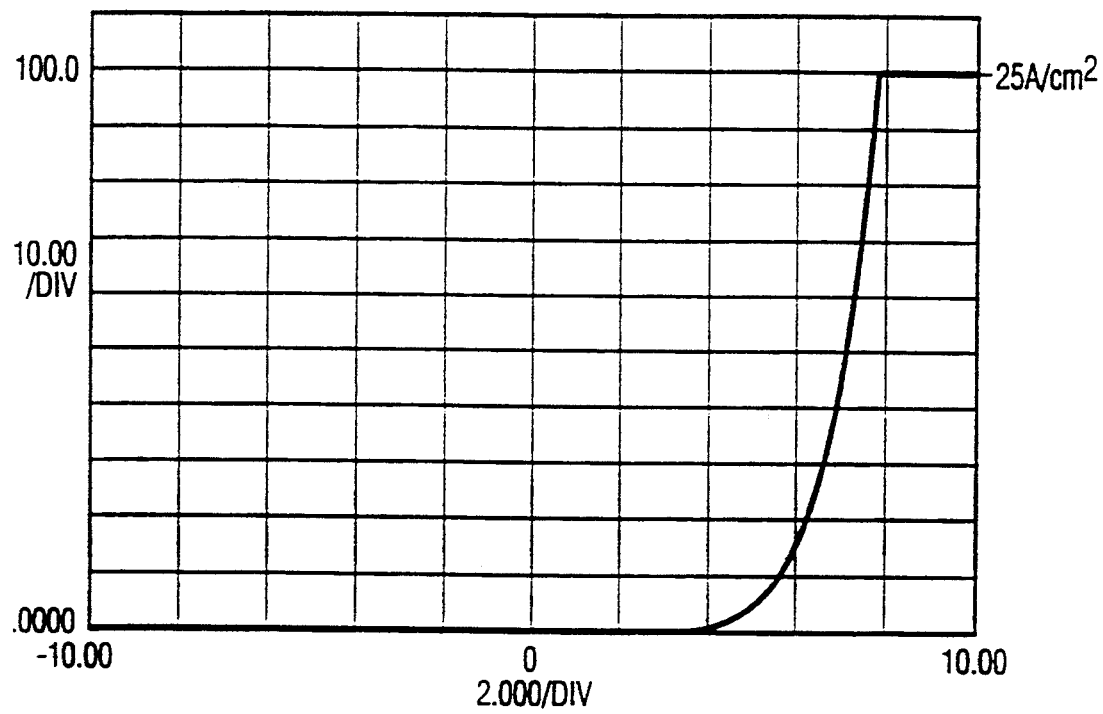

In FIG. 5 "MBE871" identifies the layer, "300 C/7HR" indicates that the alloying was carried out at a temperature of 300° C. for a period of 7 hours and "LD" indicates the size of the contact area of the gold contact. In the plot in FIG. 5 this is indicated to be $4 \times 10^{-3}$cm$^2$.

Figure 6:
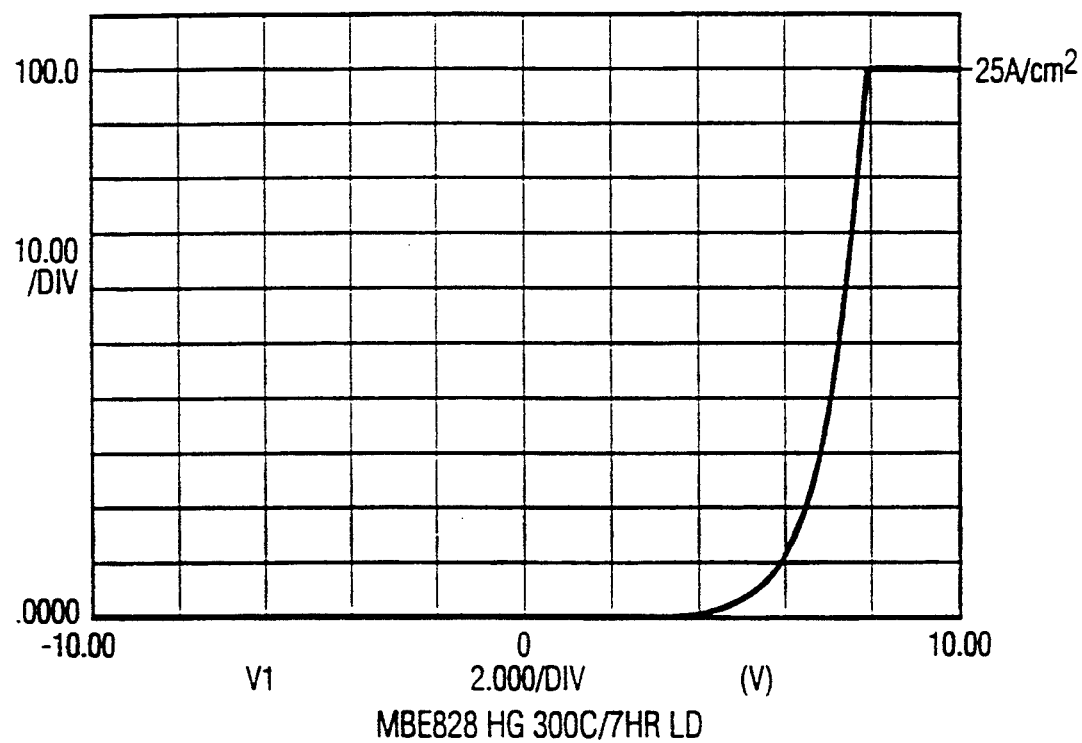

In FIG. 6 "MBE 828" identifies the layer.

Figure 7:
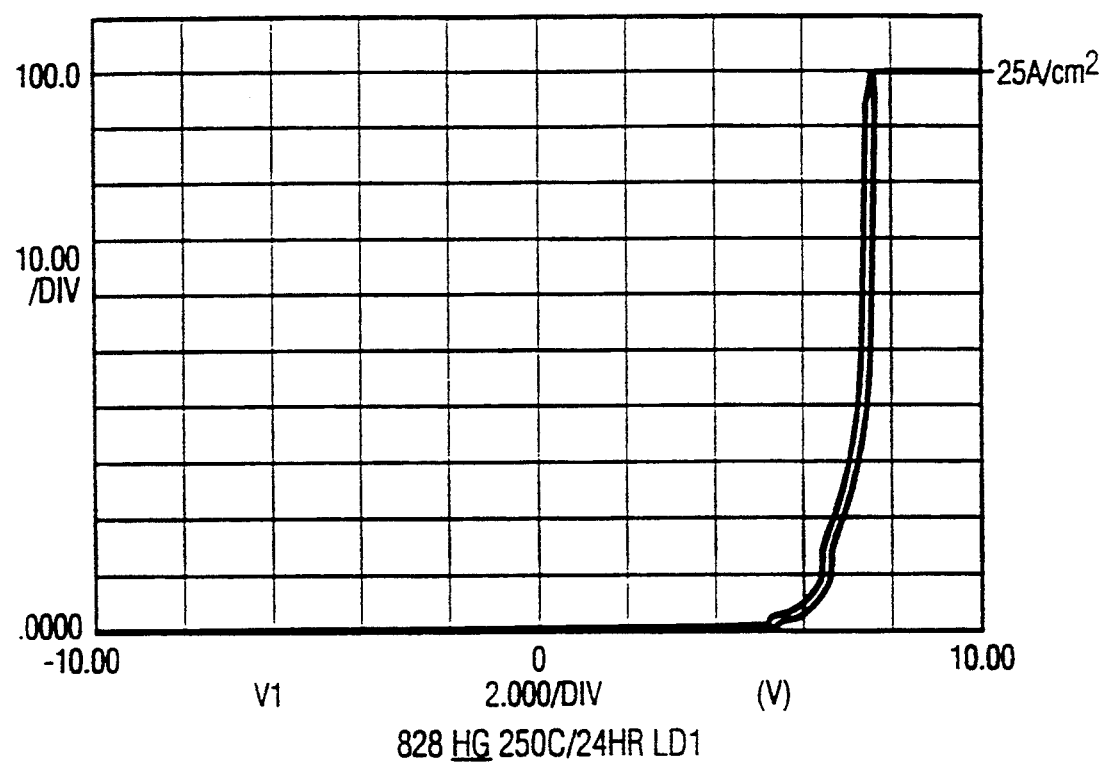

In FIG. 7 "250C/24HR" indicates that the alloying was carried out at a temperature of 250° C. for a period of 24 hours.

Figure 8:
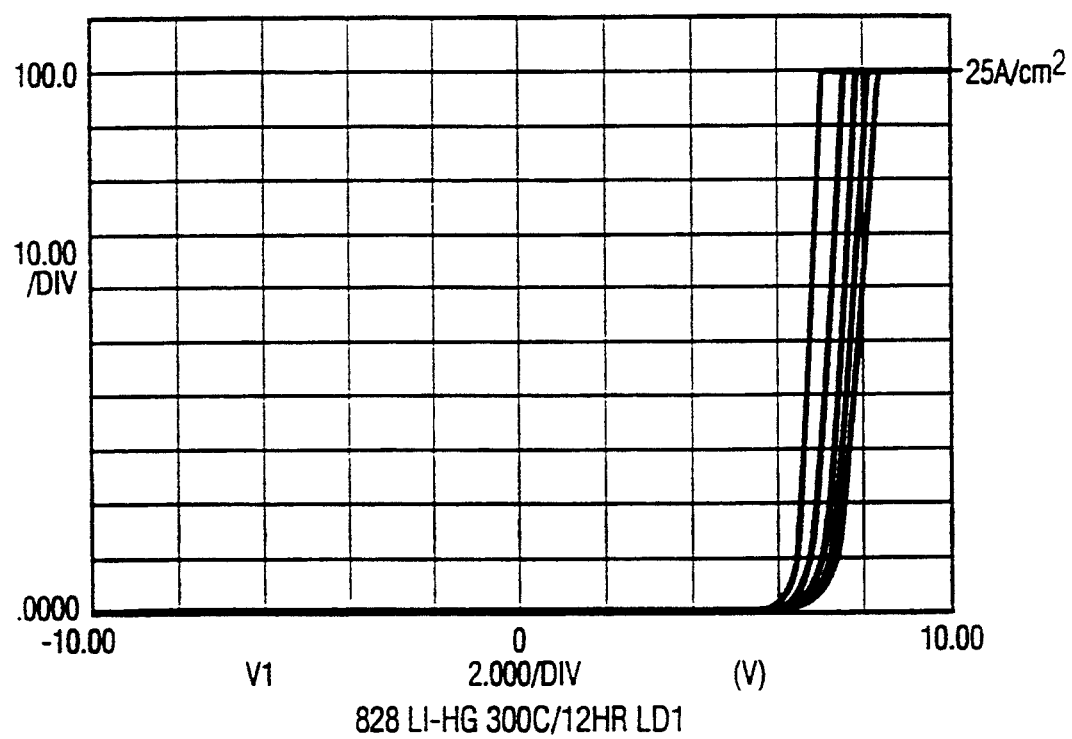

In FIG. 8 "Li-Hg" indicates that the Hg bath was doped with Li to a concentration of $10^{17}$ and "300° C./12HR" indicates that alloying was carried out at a temperature of 300° C. for a period of 12 hours.

Figure 9:
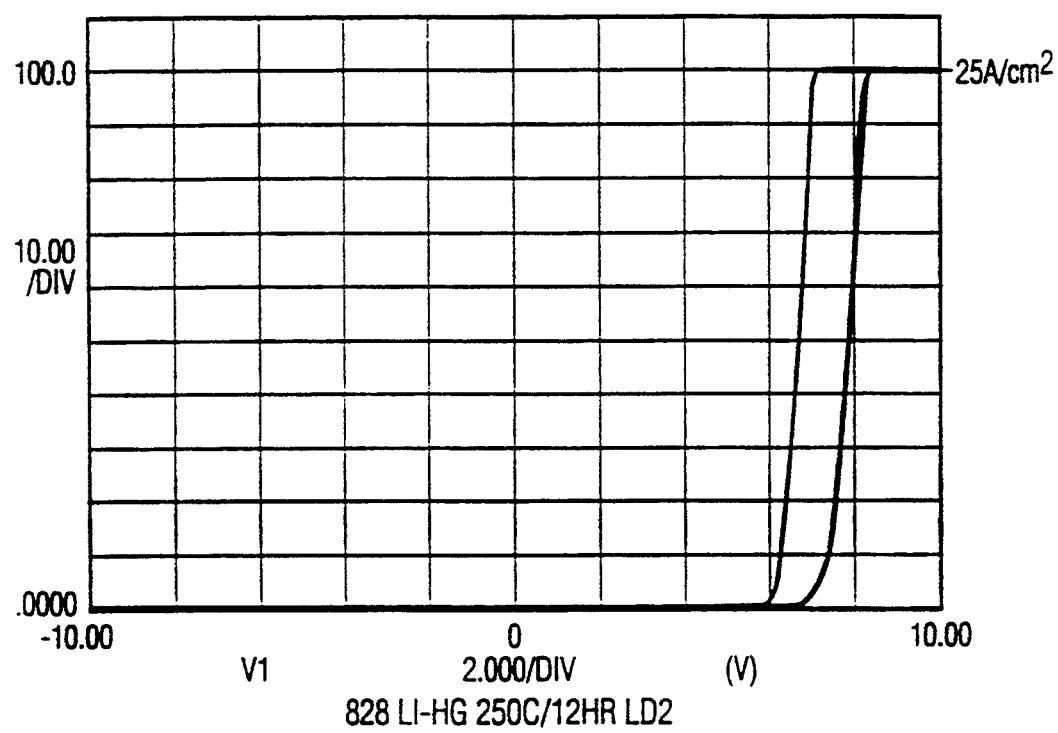

In FIG. 9 "250C/12HR" indicates that the alloying was carried out at 250° C. for a period of 12 hours.

In all these examples, the p-type ZnSe layers were nitrogen doped with a doping level of $\sim 10^{17}$.

Also shown in the plots is the current level corresponding to a current density of 25 A/cm$^2$. The current levels are 100 mA and 50 mA for "LD" and "SD", respectively. The thickness of the MBE828, MBE880 SnSe layers were 1 μm and the MBE871 ZnSe layers were 2 μm.

The plots shown are produced by a vertical application of voltage.

Figure 2:
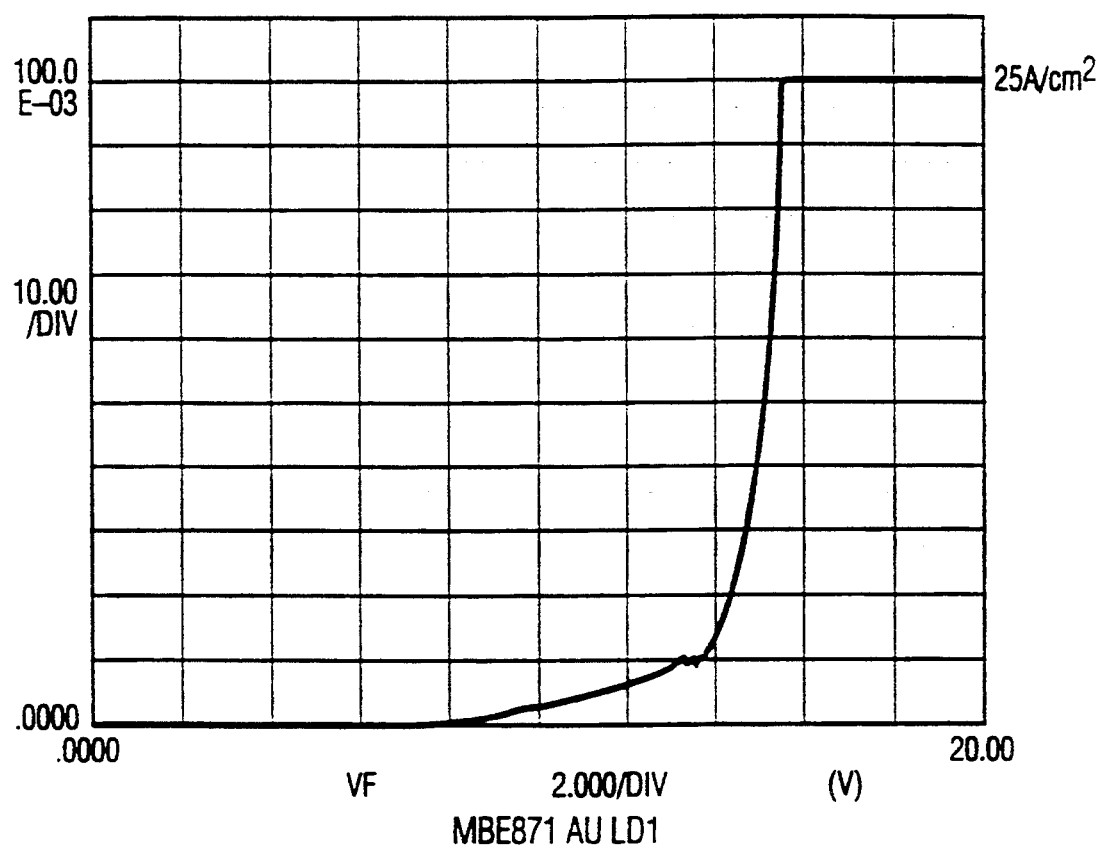
FIG. 2 is an I-V plot of a p-type zinc selenide layer directly provided with a gold contact.

The plot shown in FIG. 2 was carried out in the same manner except that the Au contact was evaporated directly on the ZnSe layer.

As shown in the plots of FIGS. 3-9 a voltage level of 6.5-8 V is required to obtain a current density level of the order of 25 A/cm$^2$ when the method of the invention is employed. However when the method of the invention is not employed, a voltage level of about 16 V is required to obtain a current density level also of 25 A/cm$^2$ as shown in FIG. 2.

Thus the method of the invention clearly results in a significantly superior ohmic contact to the p-type ZnSe layer.

We claim:

1. A method of providing an improved ohmic type contact on a p-type ZnSe layer provided on a substrate, said method comprising immersing said ZnSe layer in a Hg bath, heated to a temperature in excess of 200° C., for a time greater than 120 minutes, thereby providing a layer of $Hg_xZn_{1-x}Se$ on said layer of ZnSe the value x varying from 0 at the surface of the ZnSe layer to 1 at the surface of the $Hg_xZn_{1-x}Se$ layer.

2. The method of claim 1 wherein the layer of $Hg_xZn_{1-x}Se$ is doped with Li by addition of a doping amount of Li to the Hg bath.

3. The method of claim 1 wherein the Hg bath is heated to a temperature of 250°-350° C.

4. The method of claim 1 wherein a conductive metal layer is provided on the layer of $Hg_xZn_{1-x}Se$.

5. The method of claim 4 wherein the conductive metal layer is provided on the layer of $Hg_xZn_{1-x}Se$ by evaporation.

6. The method of claim 1 wherein the Hg bath is heated to a temperature of 250°-350° C. for a period of 4-24 hours.

7. A method of providing an improved ohmic type contact on a p-type ZnSSe layer provided on a substrate, said method comprising immersing said ZnSSe layer in a Hg bath, heated to a temperature in excess of 200° C., for a time greater than 120 minutes thereby providing a layer of $Hg_xZn_{1-x}Se_bS_c$ on said layer of ZnSSe the value x varying from 0 at the surface of the ZnSSe layer, b and c each having a value of 0−1 and the sum of the values of b+c being 1.

* * * * *